(12) United States Patent
Jeong et al.

(10) Patent No.: US 12,708,051 B2
(45) Date of Patent: Aug. 11, 2026

(54) SEMICONDUCTOR PACKAGE

(71) Applicant: Samsung Electronics Co., Ltd., Suwon-si (KR)

(72) Inventors: Kihong Jeong, Jeonju-si (KR); Sangsub Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 238 days.

(21) Appl. No.: 18/612,474

(22) Filed: Mar. 21, 2024

(65) Prior Publication Data

US 2024/0234367 A1 Jul. 11, 2024

Related U.S. Application Data

(63) Continuation of application No. 18/101,246, filed on Jan. 25, 2023, now Pat. No. 12,237,302, which is a (Continued)

(30) Foreign Application Priority Data

Feb. 11, 2020 (KR) ........................ 10-2020-0016210

(51) Int. Cl.
*H10W 90/00* (2026.01)
*H10W 90/20* (2026.01)
*H10W 90/24* (2026.01)

(52) U.S. Cl.
CPC .......... *H10W 90/00* (2026.01); *H10W 90/231* (2026.01); *H10W 90/24* (2026.01); (Continued)

(58) Field of Classification Search
CPC .................. H01L 2225/06562; H01L 25/0652
See application file for complete search history.

(56) References Cited

U.S. PATENT DOCUMENTS 8,674,494 B2 3/2014 Nam et al.
9,070,423 B2 6/2015 Crisp et al.
(Continued)

FOREIGN PATENT DOCUMENTS

KR 10-2013-0026800 A 3/2013
KR 101692792 B1 1/2017
(Continued)

OTHER PUBLICATIONS

Office Action dated Mar. 29, 2024 from the Korean Intellectual Property Office (KIPO) for Korean Patent Application No. 10-2020-0016210.

*Primary Examiner* — Yu-Hsi D Sun
(74) *Attorney, Agent, or Firm* — Muir Patent Law, PLLC

(57) ABSTRACT

A semiconductor package includes a package substrate, a processor chip mounted on the package substrate, a first stack structure on the package substrate, the first stack structure including a number M of memory chips stacked on the processor chip, and a second stack structure on the package substrate and spaced apart from the processor chip, the second stack structure including a number N of memory chips stacked on the package substrate. A number Q of channels that electrically connect the memory chips of the second stack structure with the processor chip may be greater than a number P of channels that electrically connect the memory chips of the first stack structure with the processor chip, or the number N of memory chips included in the second stack structure may be greater than the number M of memory chips included in the first stack structure.

18 Claims, 11 Drawing Sheets

Related U.S. Application Data continuation of application No. 17/015,346, filed on Sep. 9, 2020, now Pat. No. 11,569,200.

(52) U.S. Cl.
CPC ........ *H10W 90/291* (2026.01); *H10W 90/724* (2026.01); *H10W 90/752* (2026.01); *H10W 90/754* (2026.01)

(56) References Cited

U.S. PATENT DOCUMENTS

| | | | |
|---|---|---|---|
| 9,847,319 B2 | 12/2017 | Song et al. | |
| 9,991,226 B2 | 6/2018 | Park | |
| 10,204,892 B2 | 2/2019 | Lee et al. | |
| 10,217,722 B2 | 2/2019 | Park | |
| 10,393,799 B2 | 8/2019 | Kim | |
| 2017/0040289 A1 | 2/2017 | Lim et al. | |
| 2019/0148349 A1 | 5/2019 | Kim | |
| 2019/0259742 A1 | 8/2019 | Han et al. | |
| 2020/0013767 A1 | 1/2020 | Baik | |
| 2021/0193617 A1* | 6/2021 | Kosaka | H01L 23/3128 |

FOREIGN PATENT DOCUMENTS

| | | |
|---|---|---|
| KR | 1020130024567 B1 | 9/2017 |
| KR | 10-2017-0140988 | 12/2017 |
| KR | 10-2018-0046990 | 5/2018 |

* cited by examiner

SEMICONDUCTOR PACKAGE

CROSS-REFERENCE TO RELATED APPLICATIONS

This is a continuation application of U.S. patent application Ser. No. 18/101,246, filed Jan. 25, 2023, which is a continuation application of U.S. patent application Ser. No. 17/015,346, filed Sep. 9, 2020, the entire contents of each of which is hereby incorporated by reference.

This application also claims priority to Korean Patent Application No. 10-2020-0016210, filed on Feb. 11, 2020, in the Korean Intellectual Property Office, and entitled: "Semiconductor Package and Method of Manufacturing Semiconductor Package," which is incorporated by reference herein in its entirety.

BACKGROUND

1. Field

Embodiments relate to a semiconductor package and a method of manufacturing the semiconductor package.

2. Description of the Related Art

In a multi chip package including a plurality of semiconductor chips therein, as the number of the semiconductor chips and the number of input/output channels (I/O channels) increase in order for high capacity and high performance, the semiconductor chips may be arranged in parallel with each other to thereby reduce the number of vertically stacked chips.

SUMMARY

Embodiments are directed to a semiconductor package, including a package substrate, a processor chip mounted on the package substrate, a first stack structure on the package substrate, the first stack structure including a number M of memory chips stacked on the processor chip, and a second stack structure on the package substrate and spaced apart from the processor chip, the second stack structure including a number N of memory chips stacked on the package substrate. A number Q of channels that electrically connect the memory chips of the second stack structure with the processor chip may be greater than a number P of channels that electrically connect the memory chips of the first stack structure with the processor chip, or the number N of memory chips included in the second stack structure may be greater than the number M of memory chips included in the first stack structure. M, N, P, and Q may be positive non-zero integers.

Example embodiments are also directed to a semiconductor package, including a package substrate, a semiconductor chip mounted on the package substrate, a first stack structure on the package substrate, the first stack structure including a plurality of memory chips stacked on the semiconductor chip, a second stack structure on the package substrate and spaced apart from the semiconductor chip, the second stack structure including a plurality of memory chips stacked on the package substrate, and a molding member on the package substrate and covering the semiconductor chip, the first stack structure, and the second stack structure. The memory chips of the first stack structure may be electrically connected to the semiconductor chip through the package substrate by a number P of channels, and the memory chips of the second stack structure may be electrically connected to the semiconductor chip through the package substrate by a number Q of channels. The number Q of channels connected to the memory chips of the second stack structure may be greater than the number P of channels connected to the memory chips of the first stack structure. P and Q may be positive non-zero integers.

Embodiments are also directed to a semiconductor package, including a package substrate, a logic chip mounted on the package substrate, a first stack structure on the package substrate, the first stack structure including a plurality of memory chips stacked on the logic chip, and a second stack structure on the package substrate and spaced apart from the logic chip, the second stack structure including a plurality of memory chips stacked on the package substrate. The memory chips of the first stack structure may be electrically connected to the logic chip through the package substrate by a number P of channels, and the memory chips of the second stack structure may be electrically connected to the logic chip through the package substrate by a number Q of channels. A number of memory chips included in the second stack structure may be greater than a number of memory chips included in the first stack structure. P and Q may be positive non-zero integers.

Embodiments are also directed to a semiconductor package, including a first stack structure arranged on a semiconductor chip on a package substrate and a second stack structure arranged on the package substrate and spaced apart from the first stack structure. Each of the first and second stack structures may include a plurality of sequentially stacked memory chips. The number of channels electrically connecting the memory chips of the second stack structure and the semiconductor chip may be greater than the number of the channel(s) electrically connecting the memory chips of the first stack structure and the semiconductor chip. The number of the memory chips of the first stack structure on the semiconductor chip may be smaller than the number of the memory chips of the second stack structure.

BRIEF DESCRIPTION OF THE DRAWINGS

Features will become apparent to those of skill in the art by describing in detail example embodiments with reference to the attached drawings in which:

FIGS. 3 to 6 are cross-sectional views illustrating a method of manufacturing a semiconductor package in accordance with an example embodiment.

FIG. 10 is a plan view illustrating a semiconductor package in accordance with an example embodiment.

DETAILED DESCRIPTION

Figure 1:
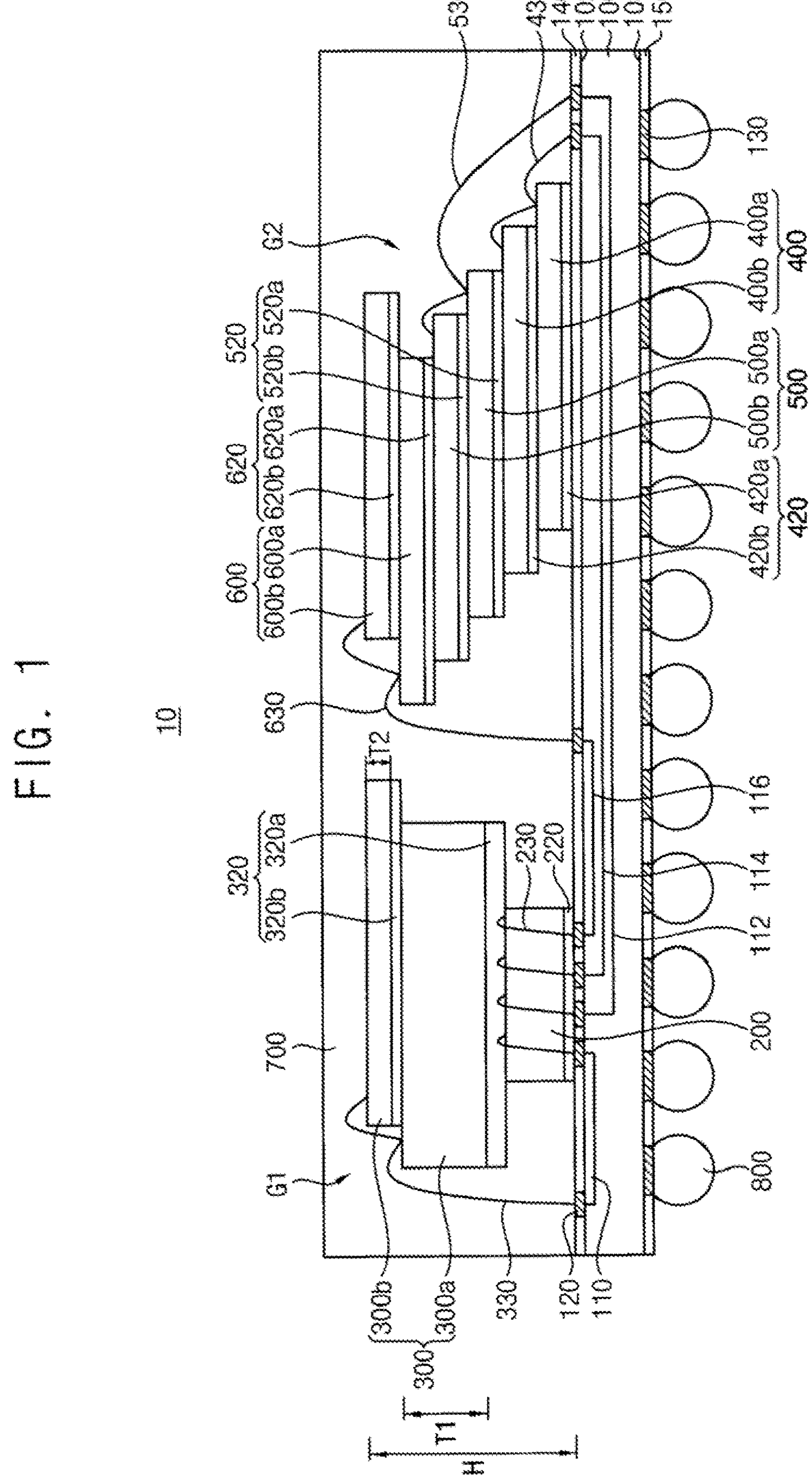
FIG. 1 is a cross-sectional view illustrating a semiconductor package in accordance with an example embodiment.

FIG. 1 is a cross-sectional view illustrating a semiconductor package in accordance with an example embodiment.

Figure 2:
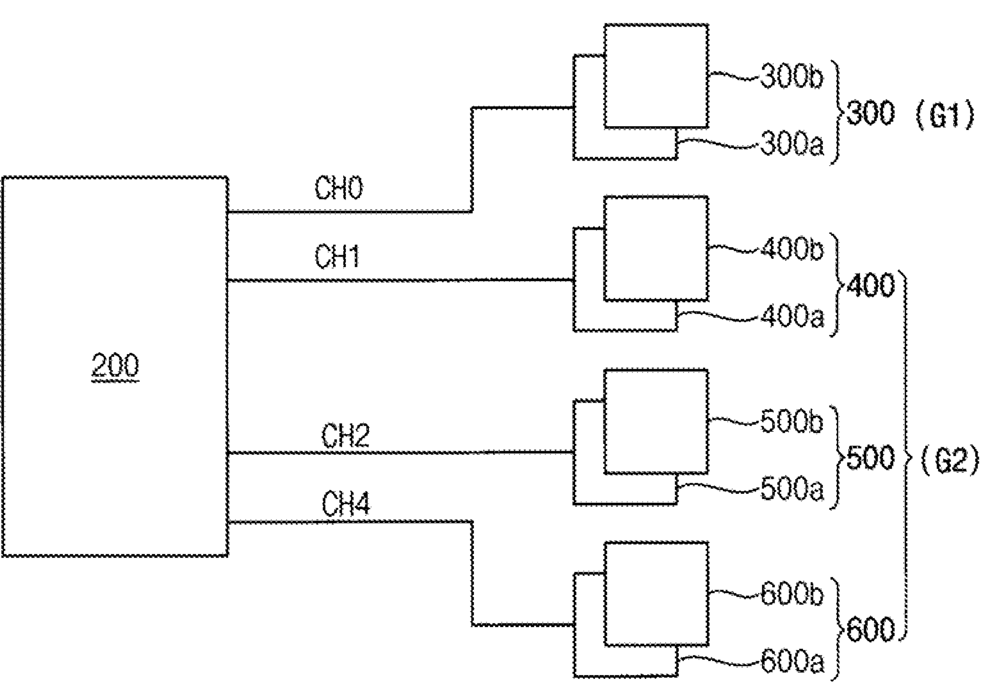
FIG. 2 is a block diagram illustrating signal transmission channels in the semiconductor package in FIG. 1.

FIG. 2 is a block diagram illustrating signal transmission channels in the semiconductor package in FIG. 1.

Referring to FIGS. 1 and 2, a semiconductor package 10 may include a package substrate 100, a semiconductor chip 200, first and second stack structures G1, G2 each including a plurality of memory chips, and a molding member 700. Additionally, the semiconductor package 10 may further include outer connection members 800.

In an example embodiment, the semiconductor package 10 may be a multi chip package (MCP) including different kinds of semiconductor chips. The semiconductor package 10 may be a System In Package (SIP) including a plurality of semiconductor chips stacked or arranged in one package to perform all or most of the functions of an electronic system.

The package substrate 100 may be a substrate having an upper surface 102 and a lower surface 104 opposite to each other. The package substrate 100 may include, for example, a printed circuit board (PCB), a flexible substrate, a tape substrate, etc. The package substrate may include a multi circuit board having vias and various circuit elements therein. The package substrate 100 may include wirings 110, 112, 114, 116 therein as channels for electrical connection between the semiconductor chip 200 and the memory chips.

Substrate pads 120 may be arranged on the upper surface 102 of the package substrate 100. The substrate pads 120 may be connected to the wirings, respectively. The wirings may extend on the upper surface 102 of the package substrate 100 or inside the package substrate 100. For example, at least a portion of the wiring may be used as the substrate pad, that is, a landing pad.

Although some substrate pads are illustrated, the number and locations of the substrate pads are exemplarily illustrated and may be varied.

A first insulation layer 140 may be formed on the upper surface 102 of the package substrate 100 to expose the substrate pads 120. The first insulation layer 140 may cover the entire upper surface 102 of the package substrate 100 except the substrate pad 120. The first insulation layer may include, for example, a solder resist.

In an example embodiment, the semiconductor chip 200 may be mounted on the package substrate 100. The semiconductor chip 200 may be adhered onto the upper surface 102 of the package substrate 100 by an adhesive member 220. The semiconductor chip 200 may include an integrated circuit. For example, the semiconductor chip 200 may be a logic chip including a logic circuit. The logic chip may be a controller for controlling memory chips. The semiconductor chip may be a processor chip such as ASIC for host such as CPU, GPU, SoC, etc.

The semiconductor chip 200 may include chip pads on an upper surface, which may be an active surface. The chip pads may include an input/output terminal serving as a power pin, an input/output terminal serving as a ground pin, or an input/output terminal serving as a data pin.

The semiconductor chip 200 may be electrically connected to the package substrate 100 by conductive connection members 230. For example, the conductive connection member 230 may electrically connect the chip pad of the semiconductor chip 200 to the substrate pad 120 of the package substrate 100. The conductive connection member 230 may include, for example, a bonding wire. The semiconductor chip 200 may be stacked on the package substrate 100 by the adhesive member and may be electrically connected to the package substrate 100 by a plurality of the conductive connection members 230.

A thickness of the semiconductor chip may be, for example, within a range of from 40 μm to 60 μm, and a thickness of the adhesive member may be within a range of from 15 μm to 25 μm. In an example embodiment, the thickness of the semiconductor chip may be 50 μm, and the thickness of the adhesive member may be 20 μm.

In an example embodiment, the first stack structure G1 may be stacked on the semiconductor chip 200 on the package substrate 100. The first stack structure G1 may include a plurality (M) of memory chips 300 sequentially stacked on the semiconductor chip 200. For example, the memory chip may include memory devices such as DRAM, NAND flash memory, etc.

The first stack structure G1 may include the same type of the first memory chips 300*a*, 300*b*. The first memory chips 300*a*, 300*b* may be sequentially adhered on the semiconductor chip 200 using adhesive members 320*a*, 320*b*. The first memory chips 300*a*, 300*b* may be stacked in a cascade structure. The adhesive member may include, for example, an adhesive film such as a direct adhesive film (DAF). The first memory chips 300*a*, 300*b* may have an area greater than that of the underlying semiconductor chip 200. Accordingly, at least a portion of the first memory chip may have a structure that includes an overhang portion protruding from a side of the semiconductor chip 200.

A thickness of the lowermost first memory chip 300*a* of the first memory chips 300 may be greater than a thickness of other first memory chip 300*b*. When the lowermost first memory chip 300*a* has a relatively greater thickness, cracks may be prevented from occurring in the lowermost first memory chip 300*a*. An area of the lowermost first memory chip 300*a* may be greater than an area of the underlying semiconductor chip 200.

The first memory chips 300*a*, 300*b* may be electrically connected to the package substrate 100 by conductive connection members 330. For example, the conductive connection member 330 may electrically connect a chip pad of the first memory chip 300 to the substrate pad 120 of the package substrate 100. The conductive connection member 330 may include, for example, a bonding wire. The first memory chip 300 may be electrically connected to the package substrate 100 by a plurality of the conductive connection members 330.

The types and the number of the memory chips of the first stack structure G1 may be varied. For example, the first stack structure G1 may further include a plurality of fifth memory chips.

In example embodiment, the second stack structure G2 may be stacked on the package substrate 100. The second stack structure G2 may be arranged on the package substrate 100 in a position that is spaced apart from the first stack structure G1. The first and second stack structures G1, G2 may be arranged side by side on the package substrate 100. The second stack structure G2 may include a plurality (for example, a number N) of memory chips 400, 500, 600 sequentially stacked on the package substrate 100. The memory chip may include, for example, memory devices such as DRAM, NAND flash memory, etc.

The second stack structure G2 may include the same type of the second memory chips 400*a*, 400*b*, the same type of the third memory chips 500*a*, 500*b*, and the same type of the fourth memory chips 600*a*, 600*b*. The second memory chips 400*a*, 400*b* may be sequentially adhered on the package substrate 100 using adhesive members 420*a*, 420*b*. The third memory chips 500*a*, 500*b* may be sequentially adhered on the second memory chip 400 using adhesive members 520*a*,

520*b*. The fourth memory chips 600*a*, 600*b* may be sequentially adhered on the third memory chip 500 using adhesive members 620*a*, 620*b*.

The second memory chips 400*a*, 400*b*, the third memory chips 500*a*, 500*b* and the lowermost fourth memory chip 600*a* may be stacked in a cascade structure. The second memory chips 400*a*, 400*b*, the third memory chips 500*a*, 500*b* and the lowermost fourth memory chip 600*a* may be sequentially offset-aligned in a direction toward the first stack structure G1 on the package substrate 100.

The second memory chips 400*a*, 400*b* may be electrically connected to the package substrate 100 by conductive connection members 430. For example, the conductive connection member 430 may electrically connect a chip pad of the second memory chip 400 to the substrate pad 120 of the package substrate 100. The conductive connection member 430 may include, for example, a bonding wire. The second memory chip 400 may be electrically connected to the package substrate 100 by a plurality of the conductive connection members 430.

The third memory chips 500*a*, 500*b* may be electrically connected to the package substrate 100 by conductive connection members 530. For example, the conductive connection member 530 may electrically connect a chip pad of the third memory chip 500 to the substrate pad 120 of the package substrate 100. The conductive connection member 530 may include, for example, a bonding wire. The third memory chip 500 may be electrically connected to the package substrate 100 by a plurality of the conductive connection members 530.

The fourth memory chips 600*a*, 600*b* may be electrically connected to the package substrate 100 by conductive connection members 630. For example, the conductive connection member 630 may electrically connect a chip pad of the fourth memory chip 600 to the substrate pad 120 of the package substrate 100. The conductive connection member 630 may include, for example, a bonding wire. The fourth memory chip 600 may be electrically connected to the package substrate 100 by a plurality of the conductive connection members 630.

The types and the number of the memory chips of the second stack structure G2 may be varied. For example, the second stack structure G2 may further include a plurality of sixth memory chips.

In an example embodiment, the memory chips of the first stack structure G1 may be electrically connected to the semiconductor chip 200 through the package substrate 100 by a number P of channel(s), and the memory chips of the second stack structure G2 may be electrically connected to the semiconductor chip 200 through the package substrate 100 by a number Q of channels (P and Q are natural numbers, for example, positive non-zero integers 1, 2, 3, etc.).

As illustrated in FIG. 2, the memory chips of the first stack structure G1 may be electrically connected to the semiconductor chip 200 by one channel CH0. The memory chips of the second stack structure G2 may be electrically connected to the semiconductor chip 200 by three channels CH1, CH2, CH3.

For example, the first memory chips 300*a*, 300*b* of the first stack structure G1 may be electrically connected to the semiconductor chip 200 by a first channel CH0. The first memory chips 300*a*, 300*b* may share the first channel CH0. A first wiring 110 of the package substrate 100 may constitute a portion of the first channel CH0.

The second memory chips 400*a*, 400*b* of the second stack structure G2 may be electrically connected to the semiconductor chip 200 by a second channel CH1. Two second memory chips 400*a*, 400*b* may share the second channel CH1. A second wiring 112 of the package substrate 100 may constitute a portion of the second channel CH1.

The third memory chips 500*a*, 500*b* of the second stack structure G2 may be electrically connected to the semiconductor chip 200 by a third channel CH2. Two third memory chips 500*a*, 500*b* may share the third channel CH2. A third wiring 114 of the package substrate 100 may constitute a portion of the third channel CH2.

The fourth memory chips 600*a*, 600*b* of the second stack structure G2 may be electrically connected to the semiconductor chip 200 by a fourth channel CH3. Two fourth memory chips 600*a*, 600*b* may share the fourth channel CH3. A fourth wiring 116 of the package substrate 100 may constitute a portion of the fourth channel CH3.

As described above, the first wiring 110 may constitute a portion of the first channel CH0, the second wiring 112 may constitute a portion of the second channel CH1, the third wiring 114 may constitute a portion of the third channel CH2, and the fourth wiring 116 may constitute a portion of the fourth channel CH3. However, the number of the channels, the number of the memory chips that share one channel, etc. are exemplarily illustrated, and may be varied.

In an example embodiment, the number (for example, 3) of paths (that is, the channels) of electrically connecting the memory chips of the second stack structure G2 and the semiconductor chip 200 may be greater than the number (for example, 1) of a path (that is, the channel) of electrically connecting the memory chips of the first stack structure G1 and the semiconductor chip 200. In this case, the number (for example, 6) of the memory chips of the second stack structure G2 may be greater than the number (for example, 2) of the memory chips of the first stack structure G1.

As illustrated in FIG. 1, since the first stack structure G1 and the second stack structure G2 are arranged side by side on the package substrate 100, the number of the memory chips vertically stacked in one package may be reduced. Further, since the memory chips of the first and second stack structures G1, G2 are arranged asymmetrically to each other such that the number of the channel(s) for the first stack structure G1 is different from the number of the channels for the second stack structure G2, the number of the memory chips of the first stack structure G1 stacked on the semiconductor chip 200 may be reduced, to thereby decrease the entire thickness of the package.

In an example embodiment, the molding member 700 may be formed on the upper surface 102 of the package substrate 100 to cover the semiconductor chip 200, the first stack structure G1 and the second stack structure G2. The molding member may include an epoxy molding compound (EMC).

The outer connection members 800 for supplying an electrical signal may be formed on the lower surface 104 of the package substrate 100. Outer connection pads 130 may be exposed from a second insulation layer 150. The second insulation layer may include a silicon oxide layer, a silicon nitride, or a silicon oxynitride layer. The outer connection member 800 for electrical connection with an external device may be disposed on the outer connection pad 130. The outer connection member 800 may include, for example, a solder ball. The semiconductor package 10 may be mounted on a module substrate (not illustrated) via the solder balls to form a memory module.

As described above, the semiconductor package 10 may include the first stack structure G1 arranged on the semiconductor chip 200 on the package substrate 100 and the second stack structure G2 arranged on the package substrate 100 and spaced apart from the first stack structure G1.

In an example embodiment, the number (for example, 3) of the channels electrically connected to the memory chips of the second stack structure G2 may be greater than the number (for example, 1) of the channel(s) electrically connected to the memory chips of the first stack structure G1. Thus, the number of the stacked memory chips of the first stack structure may be reduced. Thus, a height H of the first stack structure G1 stacked on the semiconductor chip 200 may be reduced, to thereby decrease the entire thickness of the semiconductor package 10.

Further, a design margin for the height of the first stack structure G1 may be obtained. Thus, the lowermost first memory chip 300*a* of the first stack structure G1 may be formed to be relatively thicker, to thereby prevent cracks from occurring in a bottleneck region of the lowermost first memory chip 300*a* stacked on the semiconductor chip 200 which has a relatively small area. Thus, an additional support spacer for supporting the first stack structure G1 may be omitted, to thereby reduce manufacturing cost.

Hereinafter, a method of manufacturing the semiconductor package in FIG. 1 will be described.

FIGS. 3 to 6 are cross-sectional views illustrating a method of manufacturing a semiconductor package in accordance with an example embodiment.

Figure 3:
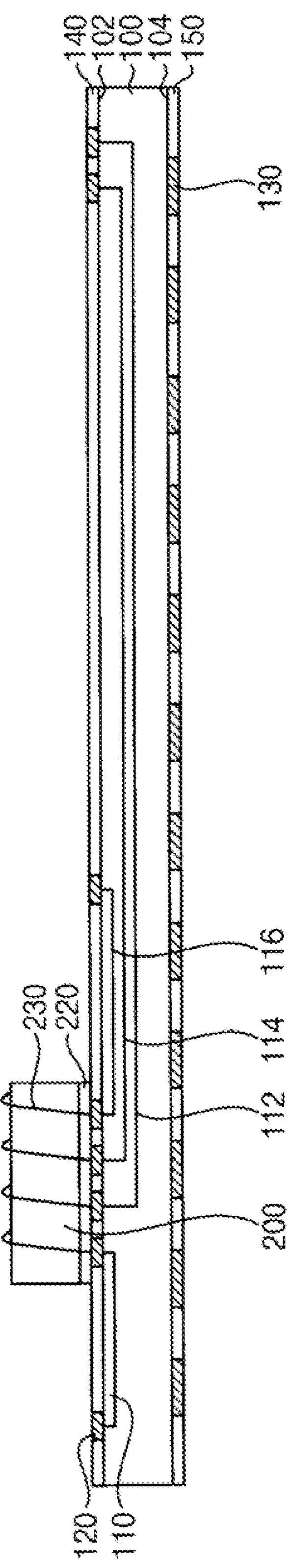

Referring to FIG. 3, a semiconductor chip 200 may be arranged on a package substrate 100.

In an example embodiment, the package substrate 100 may be a substrate having an upper surface 102 and a lower surface 104 opposite to each other. The package substrate 100 may include, for example, a printed circuit board (PCB), a flexible substrate, a tape substrate, etc. The package substrate may be a multi circuit board having vias and various circuit elements therein. The package substrate 100 may include wirings 110, 112, 114, 116 as channels for electrical connection between the semiconductor chip 200 and memory chips as described later.

Substrate pads 120 may be arranged on the upper surface 102 of the package substrate 100. The substrate pads 120 may be connected to the wirings, respectively. The wirings may extend on the upper surface 102 of the package substrate 100 or inside the package substrate 100. For example, at least a portion of the wiring may be used as the substrate pad, that is, a landing pad.

The semiconductor chip 200 may be adhered onto the upper surface 102 of the package substrate 100 by an adhesive member 220. The adhesive member may include, for example, an adhesive film such as a direct adhesive film (DAF). The semiconductor chip 200 may include an integrated circuit. For example, the semiconductor chip 200 may be a logic chip including a logic circuit. The logic chip may be a controller for controlling memory chips. The semiconductor chip may be a processor chip such as ASIC for host such as CPU, GPU, SoC, etc.

Then, the semiconductor chip may be electrically connected to the package substrate 100 by conductive connection members 230.

The conductive connection member 230 may include, for example, a bonding wire. A wire bonding process may be performed to electrically connect chip pads of the semiconductor chip 200 to the substrate pads 120 on the upper surface 102 of the package substrate 100 by the conductive connection members 230. The chip pads of the semiconductor chip 200 may be electrically connected to the substrate pads 120 by the conductive connection members 230.

Figure 4:
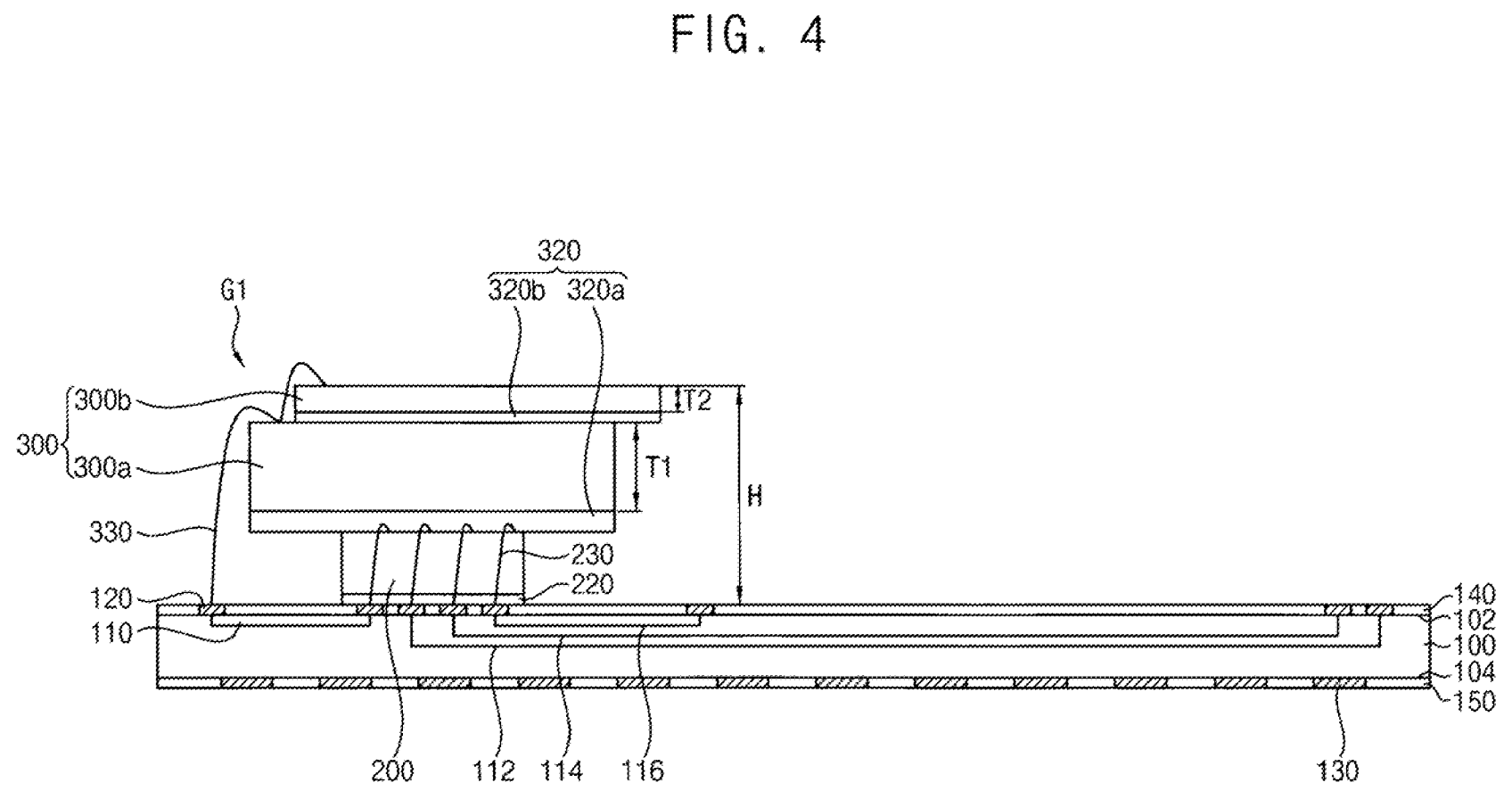

Referring to FIG. 4 a first stack structure G1 may be stacked on the semiconductor chip 200 on the substrate In an example embodiment, a die attach process may be performed to stack a plurality of first memory chips 300 on the semiconductor chip 200. The first stack structure G1 may include the same type of the first memory chips 300*a*, 300*b*. The first memory chips 300*a*, 300*b* may be sequentially adhered on the semiconductor chip 200 using adhesive members 320*a*, 320*b*. The first memory chips 300*a*, 300*b* may be stacked in a cascade structure. The memory chip may include, for example, a memory device such as DRAM, NAND flash memory, etc. The adhesive member may include an adhesive film such as a direct adhesive film (DAF).

A thickness of the lowermost first memory chip 300*a* of the first memory chips 300 may be greater than a thickness of other first memory chip 300*b*. When the lowermost first memory chip 300*a* has a relatively greater thickness, cracks may be prevented from occurring in the lowermost first memory chip 300*a*. An area of the lowermost first memory chip 300*a* may be greater than an area of the underlying semiconductor chip 200.

Then, the first memory chips 300 of the first stack structure G1 may be electrically connected to the package substrate 100 by conductive connection members 330.

The conductive connection member 330 may include, for example, a bonding wire. A wire bonding process may be performed to electrically connect chip pads of the first memory chips 300*a*, 300*b* to the substrate pads 120 on the upper surface 102 of the package substrate 100 by the conductive connection members 330. The chip pads of the first memory chips 300*a*, 300*b* may be electrically connected to the substrate pads 120 by the conductive connection members 330.

In an example embodiment, the first memory chips 300*a*, 300*b* of the first stack structure G1 may be electrically connected to the semiconductor chip 200 by a first channel CH0. Two first memory chips 300*a*, 300*b* may share the first channel CH0. The first wiring 110 of the package substrate 100 may constitute a portion of the first channel CH0.

Figure 5:
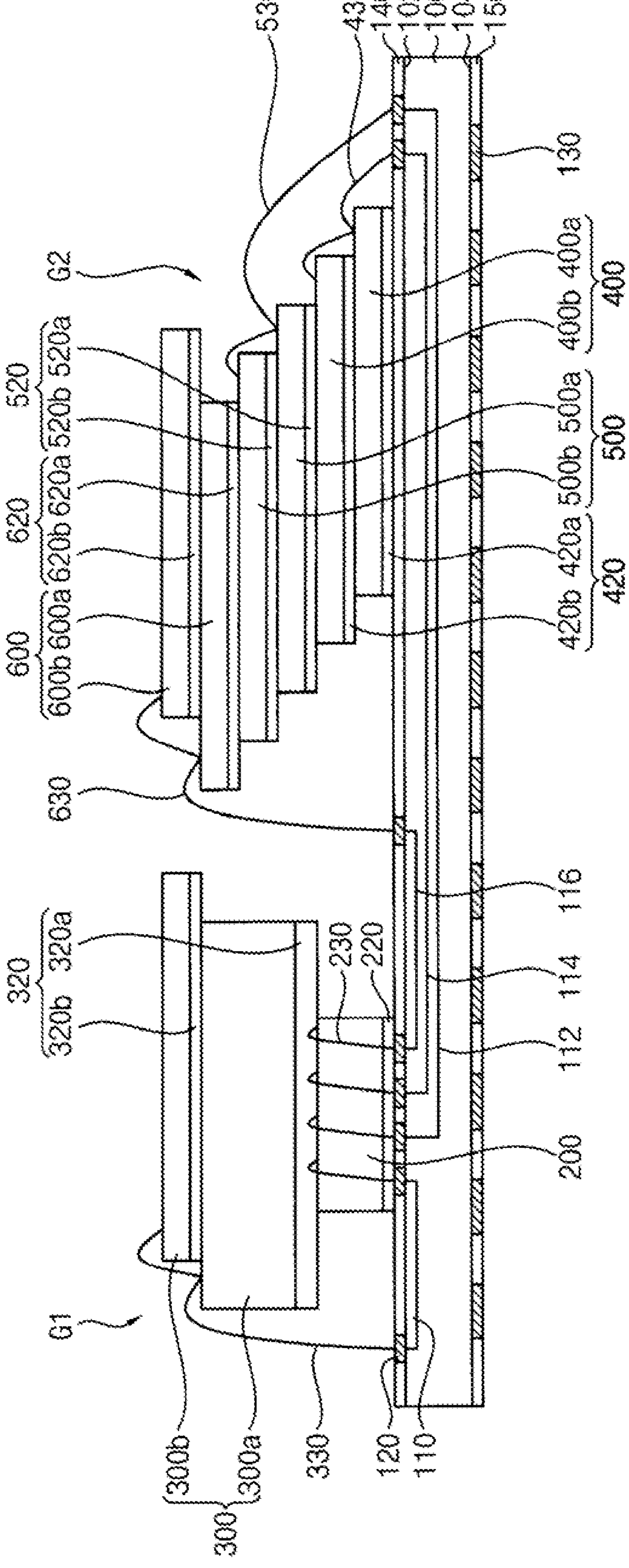

Referring to FIG. 5, a second stack structure G2 may be stacked on the package substrate 100 to be spaced apart from the first stack structure G1.

In example embodiment, a die attach process may be performed to stack a plurality of second memory chips 400, third semiconductor chips 500 and fourth memory chips 600 on the package substrate 100. The second stack structure G2 may include the same type of the second memory chips 400*a*, 400*b*, the same type of the third semiconductor chips 500 and the same type of the fourth memory chips 600*a*, 600*b*. The memory chip may include, for example, a memory device such as DRAM, NAND flash memory, etc.

The second memory chips 400*a*, 400*b* may be sequentially adhered on the package substrate 100 using adhesive members 420*a*, 420*b*. The third memory chips 500*a*, 500*b* may be sequentially adhered on the second memory chip 400 using adhesive members 520*a*, 520*b*. The fourth memory chips 600*a*, 600*b* may be sequentially adhered on the third memory chip 500 using adhesive members 620*a*, 620*b*. The adhesive member may include an adhesive film such as a direct adhesive film (DAF).

For example, the second memory chips 400*a*, 400*b*, the third memory chips 500*a*, 500*b* and the lowermost fourth memory chip 600*a* may be stacked in a cascade structure. The second memory chips 400*a*, 400*b*, the third memory chips 500*a*, 500*b* and the lowermost fourth memory chip

600*a* may be sequentially offset-aligned in a direction toward the first stack structure G1 on the package substrate 100.

Then, the second memory chips 400, the third semiconductor chip 500 and the fourth memory chips 600 of the second stack structure G2 may be electrically connected to the package substrate 100 by conductive connection members 430, 530, 630.

A wire bonding process may be performed to electrically connect chip pads of the second memory chips 400*a*, 400*b* to the substrate pads 120 on the upper surface 102 of the package substrate 100 by the conductive connection members 430. The chip pads of the second memory chips 400*a*, 400*b* may be electrically connected to the substrate pads 120 by the conductive connection members 430.

A wire bonding process may be performed to electrically connect chip pads of the third memory chips 500*a*, 500*b* to the substrate pads 120 on the upper surface 102 of the package substrate 100 by the conductive connection members 530. The chip pads of the third memory chips 500*a*, 500*b* may be electrically connected to the substrate pads 120 by the conductive connection members 530.

A wire bonding process may be performed to electrically connect chip pads of the fourth memory chips 600*a*, 600*b* to the substrate pads 120 on the upper surface 102 of the package substrate 100 by the conductive connection members 630. The chip pads of the fourth memory chips 600*a*, 600*b* may be electrically connected to the substrate pads 120 by the conductive connection members 630.

In an example embodiment, the second to fourth memory chips 400, 500, 600 of the second stack structure G2 may be electrically connected to the semiconductor chip 200 by, for example, three channels CH1, CH2, CH3. Two second memory chips 400*a*, 400*b* may share a second channel CH1. A second wiring 112 of the package substrate 100 may constitute a portion of the second channel CH1. Two third memory chips 500*a*, 500*b* may share a third channel CH2. A third wiring 114 of the package substrate 100 may constitute a portion of the third channel CH2. Two fourth memory chips 600*a*, 600*b* may share a fourth channel CH3. A fourth wiring 116 of the package substrate 100 may constitute a portion of the fourth channel CH3.

Accordingly, the number (for example, 3) of paths (that is, the channels) of electrically connecting the memory chips of the second stack structure G2 and the semiconductor chip 200 may be greater than the number (for example, 1) of a path (that is, the channel) of electrically connecting the memory chips of the first stack structure G1 and the semiconductor chip 200. Thus, a height H of the first stack structure G1 stacked on the semiconductor chip 200 may be reduced, to thereby decrease the entire thickness of a semiconductor package 10.

Further, the memory chips of the first and second stack structures G1, G2 may be electrically connected to the semiconductor chip 200 by a plurality of the channels CH0, CH1, CH2, CH3, to thereby increase signal transmission speed of the semiconductor package 10.

Figure 6:
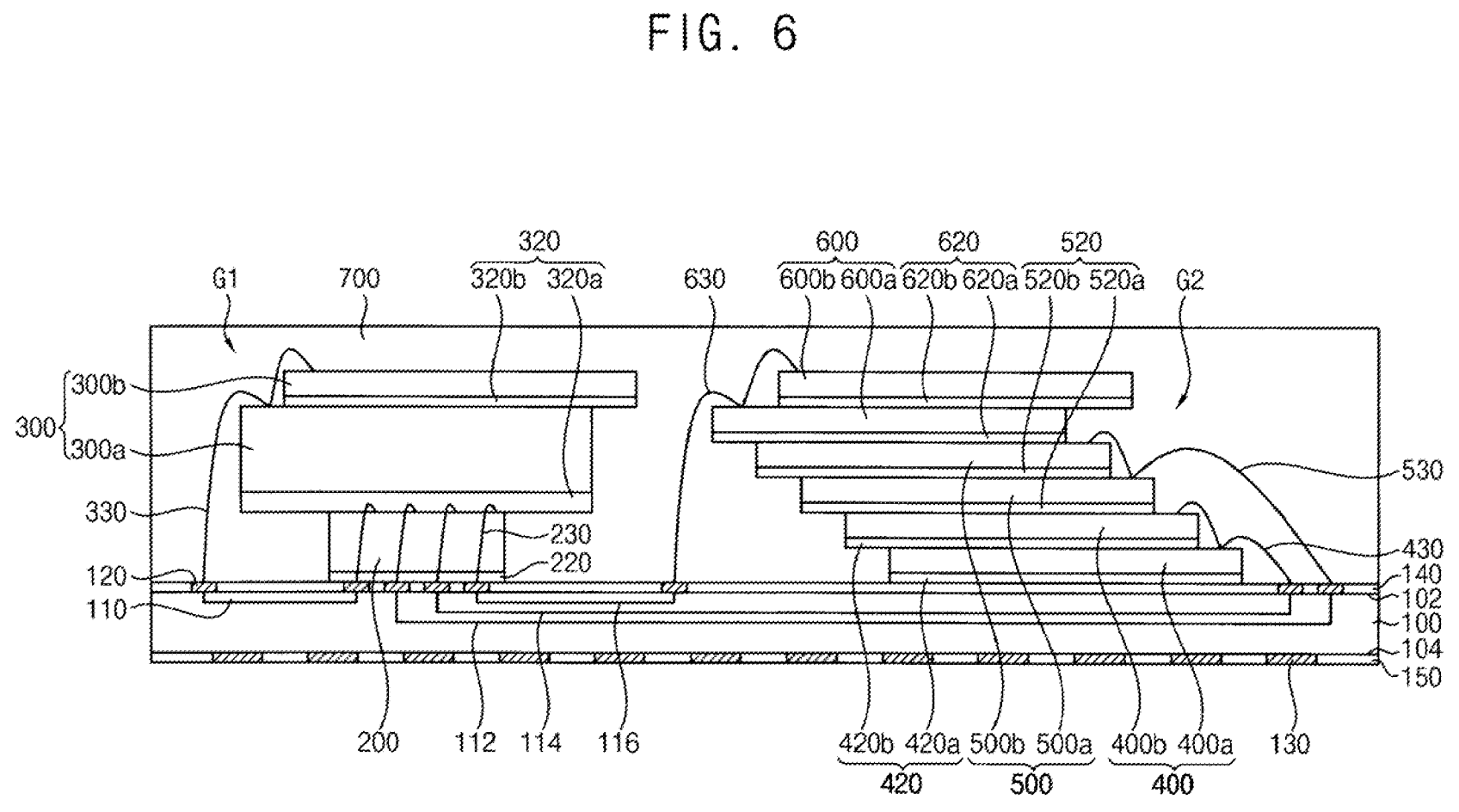

Referring to FIG. 6, a molding member 700 may be formed on the upper surface 102 of the package substrate 100 to cover the semiconductor chip 200 and the first and second stack structures G1, G2. The molding member may include epoxy molding compound (EMC).

Then, outer connection members 800 may be formed on outer connection pads 130 on the lower surface 104 of the package substrate 100, to complete a semiconductor package 10.

Figure 7:
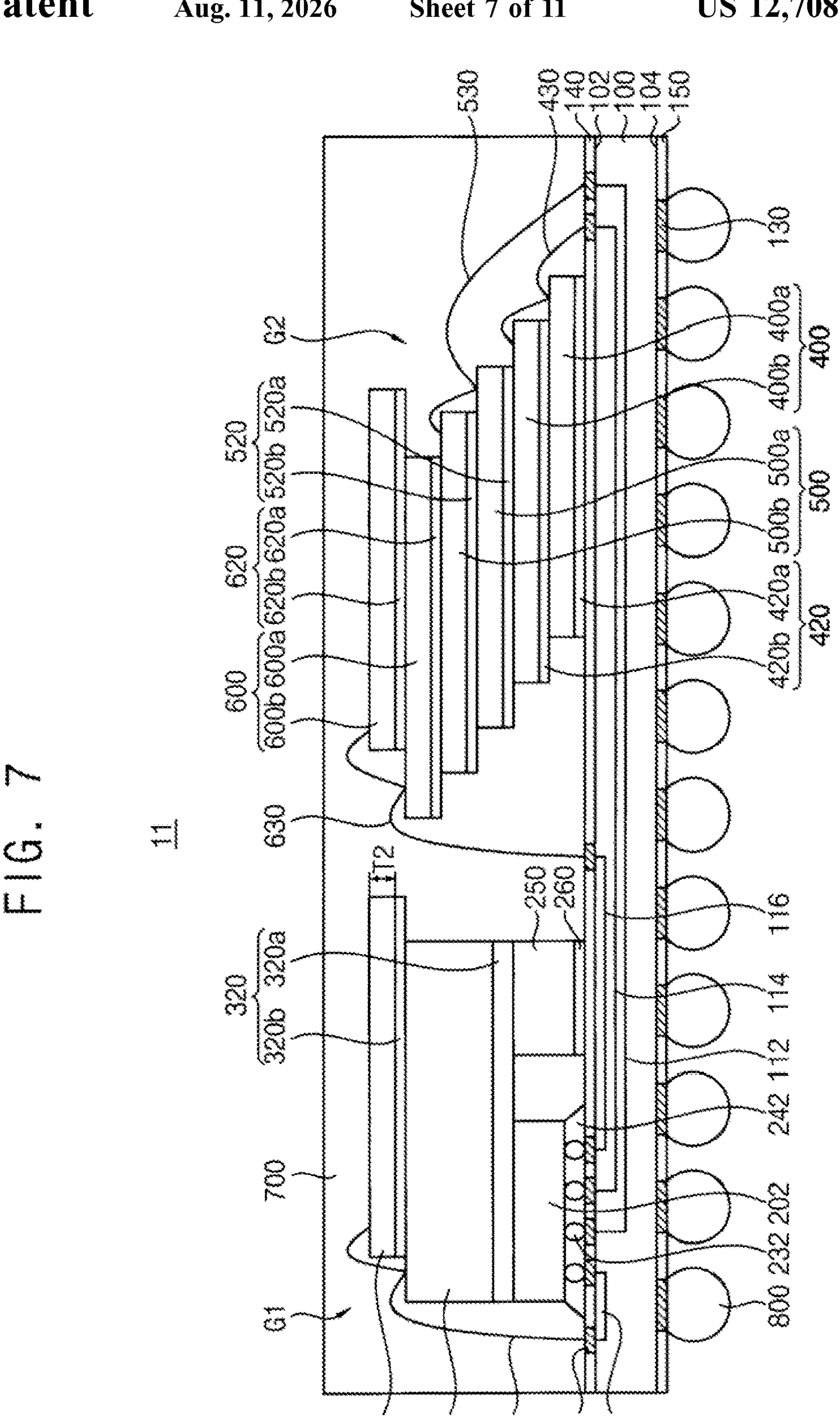
FIG. 7 is a cross-sectional view illustrating a semiconductor package in accordance with an example embodiment.

FIG. 7 is a cross-sectional view illustrating a semiconductor package in accordance with an example embodiment. The semiconductor package may be substantially the same as or similar to the semiconductor package described with reference to FIGS. 1 and 2 except for a mounting manner of a semiconductor chip and an additional support structure. Thus, same reference numerals will be used to refer to the same or like elements and any further repetitive explanation concerning the above elements may be omitted.

Referring to FIG. 7, a semiconductor package 11 may include a package substrate 100, a semiconductor chip 202, a support structure 250, first and second stack structures G1, G2 including a plurality of memory chips, and a molding member 700. Additionally, the semiconductor package 11 may further include outer connection members 800.

In an example embodiment, the semiconductor chip 202 may be mounted on the package substrate 100 in a flip chip bonding manner. In this case, the semiconductor chip 202 may be mounted on the package substrate 100 such that an active surface on which chip pads are formed faces toward the package substrate 100. The chip pads of the semiconductor chip 202 may be electrically connected to substrate pads of the package substrate 100 by conductive bumps 232, for example, solder bumps. An underfill member may be provided between the chip pad of the semiconductor chip 202 and the substrate pad 120 of the package substrate 100.

A thickness of the semiconductor chip may be, for example, within a range of from 50 μm to 70 μm, and a thickness of the conductive bump may be within a range of from 50 μm to 70 μm. In an example embodiment, the thickness of the semiconductor chip may be 60 μm, and the thickness of the conductive bump may be 65 μm.

In an example embodiment, the support structure 250 may be arranged on the package substrate 100 and may be spaced apart from the semiconductor chip 202. The support structure 250 may be adhered onto an upper surface 102 of the package substrate 100 using an adhesive member 260. The support structure 250 may include a dummy substrate or a dummy chip.

A thickness of the support structure 250 may be determined in consideration of the thickness of the semiconductor chip 202. A height of the semiconductor chip 202 from the package substrate 100 may be the same as a height of the support structure 250. Accordingly, an upper surface of the semiconductor chip 202 may be coplanar with an upper surface of the support structure 250.

The first stack structure G1 may be stacked on the semiconductor chip 202 and the support structure 250. Accordingly, the first stack structure G1 may be supported on the package substrate 100 by the semiconductor chip 202 and the support structure 250.

The first stack structure G1 may include a plurality of memory chips 300 sequentially stacked on the semiconductor chip 200 and the support structure 250. The memory chip may include, for example, memory devices such as DRAM, NAND flash memory, etc.

The first stack structure G1 may include the same type of the first memory chips 300*a*, 300*b*. The first memory chips 300*a*, 300*b* may be sequentially adhered on the semiconductor chip 200 and the support structure 250 using adhesive members 320*a*, 320*b*. The first memory chips 300*a*, 300*b* may be stacked in a cascade structure. The adhesive member may include, for example, an adhesive film such as a direct adhesive film (DAF).

A thickness of the lowermost first memory chip 300*a* of the first memory chips 300 may be greater than a thickness of other first memory chip 300*b*. When the lowermost first memory chip 300*a* has a relatively greater thickness, cracks may be prevented from occurring in the lowermost first memory chip 300*a*. An area of the lowermost first memory chip 300*a* may be greater than an area of the underlying semiconductor chip 200.

The first memory chips 300*a*, 300*b* may be electrically connected to the package substrate 100 by conductive connection members 330. For example, the conductive connection member 330 may electrically connect a chip pad of the first memory chip 300 to the substrate pad 120 of the package substrate 100. The conductive connection member 330 may include, for example, a bonding wire. The first memory chip 300 may be electrically connected to the package substrate 100 by a plurality of the conductive connection members 330.

The types and the number of the memory chips of the first stack structure G1 may be varied. For example, the first stack structure G1 may further include a plurality of fifth memory chips.

In example embodiment, the second stack structure G2 may be stacked on the package substrate 100. The second stack structure G2 may be arranged on the package substrate 100 to be spaced apart from the first stack structure G1. The first and second stack structures G1, G2 may be arranged side by side on the package substrate 100. The second stack structure G2 may include a plurality (for example, a number Q) of memory chips 400, 500, 600 sequentially stacked on the package substrate 100. The memory chip may include, for example, memory devices such as DRAM, NAND flash memory, etc.

The second stack structure G2 may include the same type of the second memory chips 400*a*, 400*b*, the same type of the third memory chips 500*a*, 500*b* and the same type of the fourth memory chips 600*a*, 600*b*. The second memory chips 400*a*, 400*b* may be sequentially adhered on the package substrate 100 using adhesive members 420*a*, 420*b*. The third memory chips 500*a*, 500*b* may be sequentially adhered on the second memory chip 400 using adhesive members 520*a*, 520*b*. The fourth memory chips 600*a*, 600*b* may be sequentially adhered on the third memory chip 500 using adhesive members 620*a*, 620*b*.

The second, third and fourth memory chips 400*a*, 400*b*, 500*a*, 500*b*, 600*a*, 600*b* may be electrically connected to the package substrate 100 by conductive connection members 430, 530, 630. For example, the conductive connection member 430, 530, 603 may electrically connect chip pads of the second, third and fourth memory chips 400, 500, 600 to the substrate pads 120 of the package substrate 100. For example, the conductive connection member 430, 530, 630 may include a bonding wire. Accordingly, the second, third and fourth memory chips 400, 500, 600 may be electrically connected to the package substrate 100 by a plurality of the conductive connection members 430, 530, 630.

Figure 8:
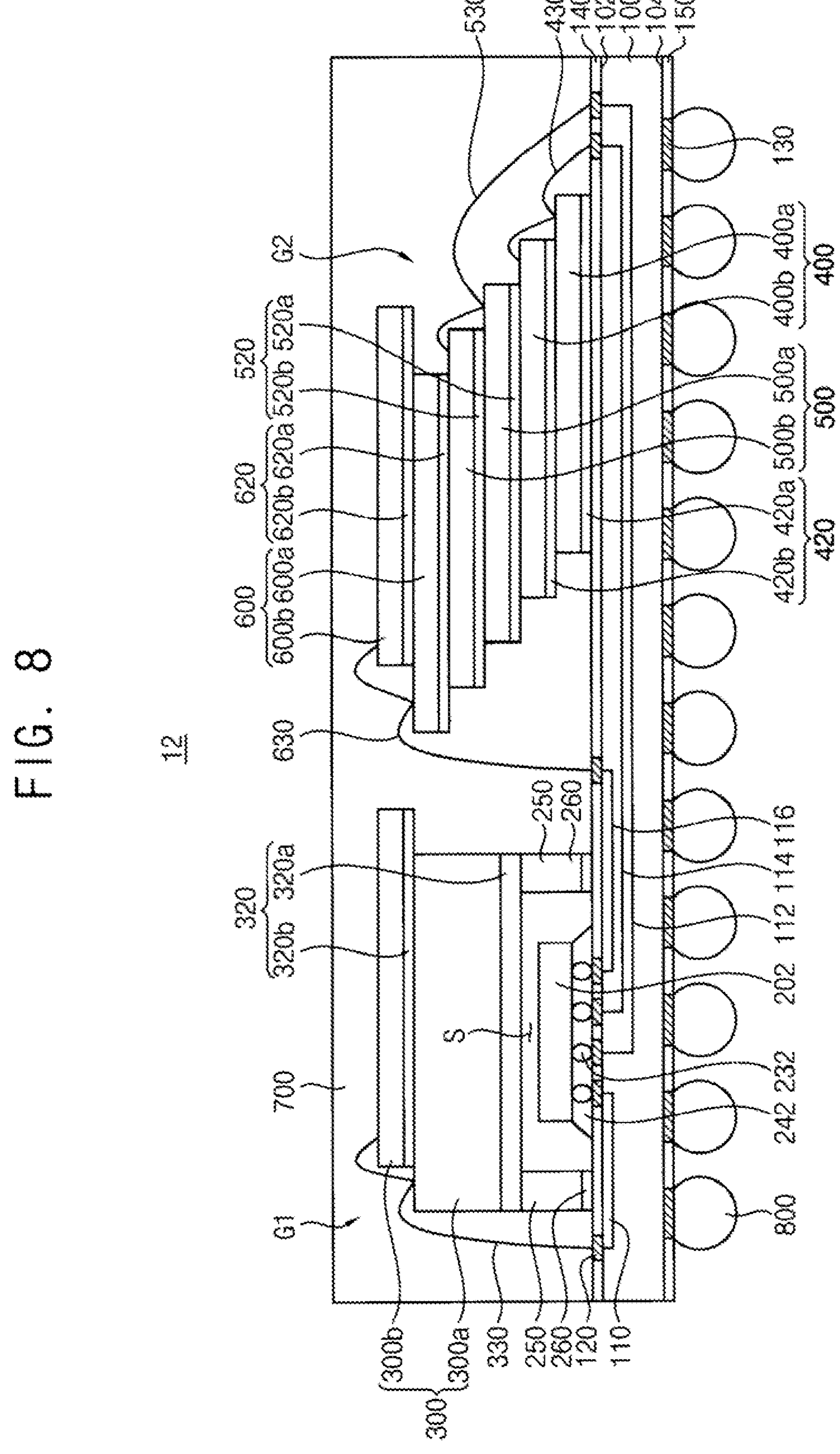
FIG. 8 is a cross-sectional view illustrating a semiconductor package in accordance with an example embodiment.

FIG. 8 is a cross-sectional view illustrating a semiconductor package in accordance with an example embodiment. The semiconductor package may be substantially the same as or similar to the semiconductor package described with reference to FIG. 7 except for a configuration of a support structure. Thus, same reference numerals will be used to refer to the same or like elements and any further repetitive explanation concerning the above elements may be omitted.

Referring to FIG. 8, a semiconductor package 12 may include a package substrate 100, a semiconductor chip 202, a plurality of support structures 250, first and second stack structures G1, G2 including a plurality of memory chips, and a molding member 700. Additionally, the semiconductor package 12 may further include outer connection members 800.

In an example embodiment, a plurality of the support structures 250 may be arranged on the package substrate 100 to be spaced apart from the semiconductor chip 202. The support structure 250 may be arranged in both sides of the semiconductor chip 202. A plurality of the support structures 250 may be arranged along a circumference of the semiconductor chip 202.

The support structures 250 may be adhered onto an upper surface 102 of the package substrate 100 using adhesive members 260, respectively. The support structure 250 may include a dummy substrate or a dummy chip.

A thickness of the support structure 250 may be determined in consideration of the thickness of the semiconductor chip 202. A height of the semiconductor chip 202 from the package substrate 100 may be the same as a height of the support structure 250. Accordingly, an upper surface of the semiconductor chip 202 may be coplanar with an upper surface of the support structure 250.

The first stack structure G1 may be stacked on the semiconductor chip 202 and a plurality of the support structures 250. Accordingly, the first stack structure G1 may be supported on the package substrate 100 by the support structures 250. In this case, a spacing S may be provided between the first stack structure G1 and the semiconductor chip 202.

Figure 9:
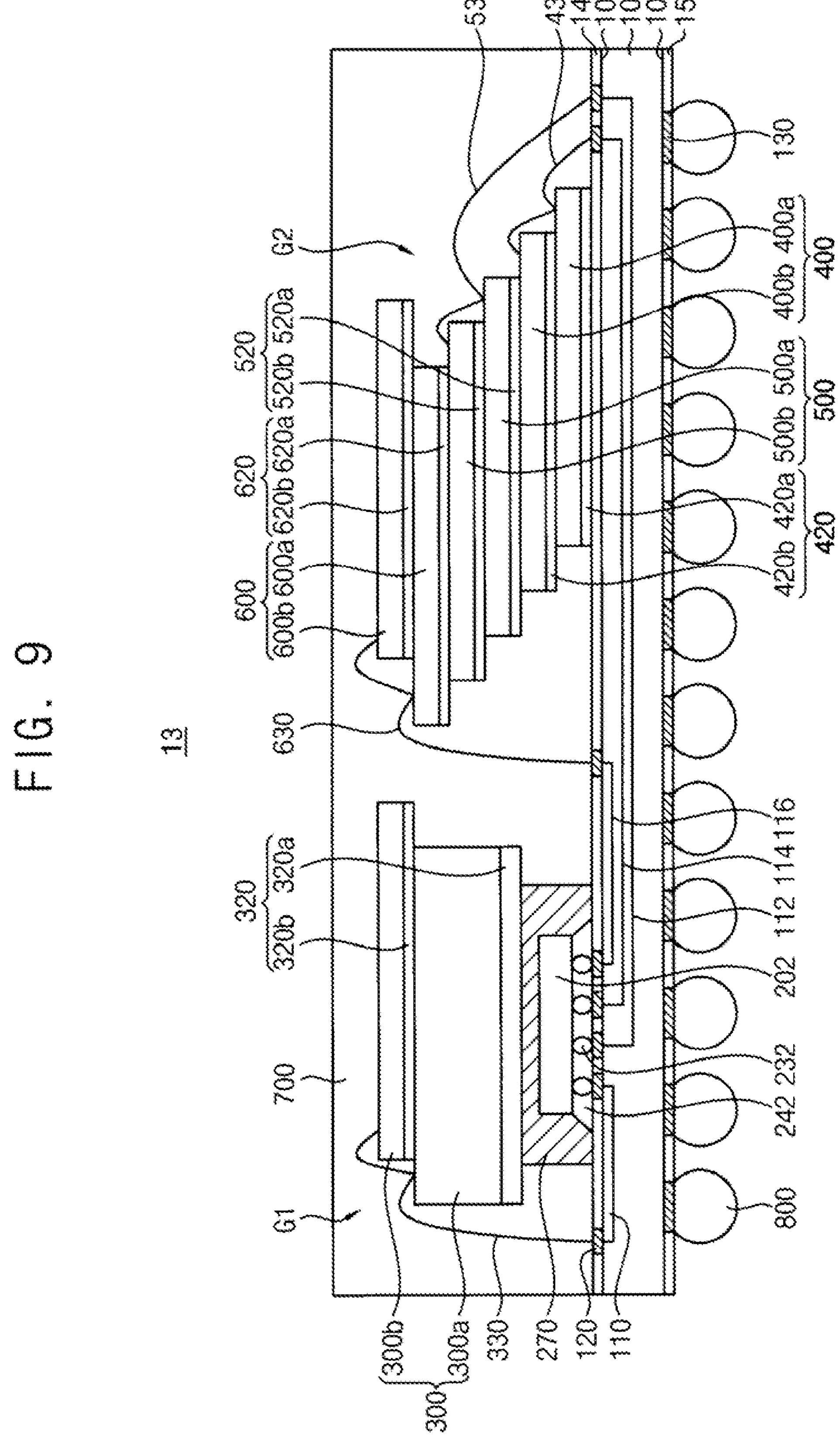
FIG. 9 is a cross-sectional view illustrating a semiconductor package in accordance with an example embodiment.

FIG. 9 is a cross-sectional view illustrating a semiconductor package in accordance with an example embodiment. The semiconductor package may be substantially the same as or similar to the semiconductor package described with reference to FIG. 7 except for a configuration of a support structure. Thus, same reference numerals will be used to refer to the same or like elements and any further repetitive explanation concerning the above elements may be omitted.

Referring to FIG. 9, a semiconductor package 13 may include a package substrate 100, a semiconductor chip 202, a second support structure 250, first and second stack structures G1, G2 including a plurality of memory chips, and a molding member 700. Additionally, the semiconductor package 13 may further include outer connection members 800.

In an example embodiment, the second support structure 270 may cover the semiconductor chip 202 on the package substrate 100. The second support structure 270 may cover an upper surface and a side surface of the semiconductor chip 202.

The second support structure 270 may have an area greater than the semiconductor chip 202. The second support structure 270 may include a material having excellent heat dissipating characteristics. For example, the second support structure 270 may include high thermal conductive material.

The first stack structure G1 may be stacked on the second support structure 270 on the package substrate 100. Accordingly, the first stack structure G1 may be supported on the package substrate 100 by the second support structure 270.

As described above, the number of the stacked memory chips of the first stack structure G1 arranged on the semiconductor chip 202 may be reduced to thereby provide a design margin for a height of the first stack structure G1. Accordingly, the second support structure 270 may be provided on the semiconductor chip 202 corresponding to the reduced thickness, to thereby improve heat dissipating characteristics of the semiconductor package 13.

Figure 10:
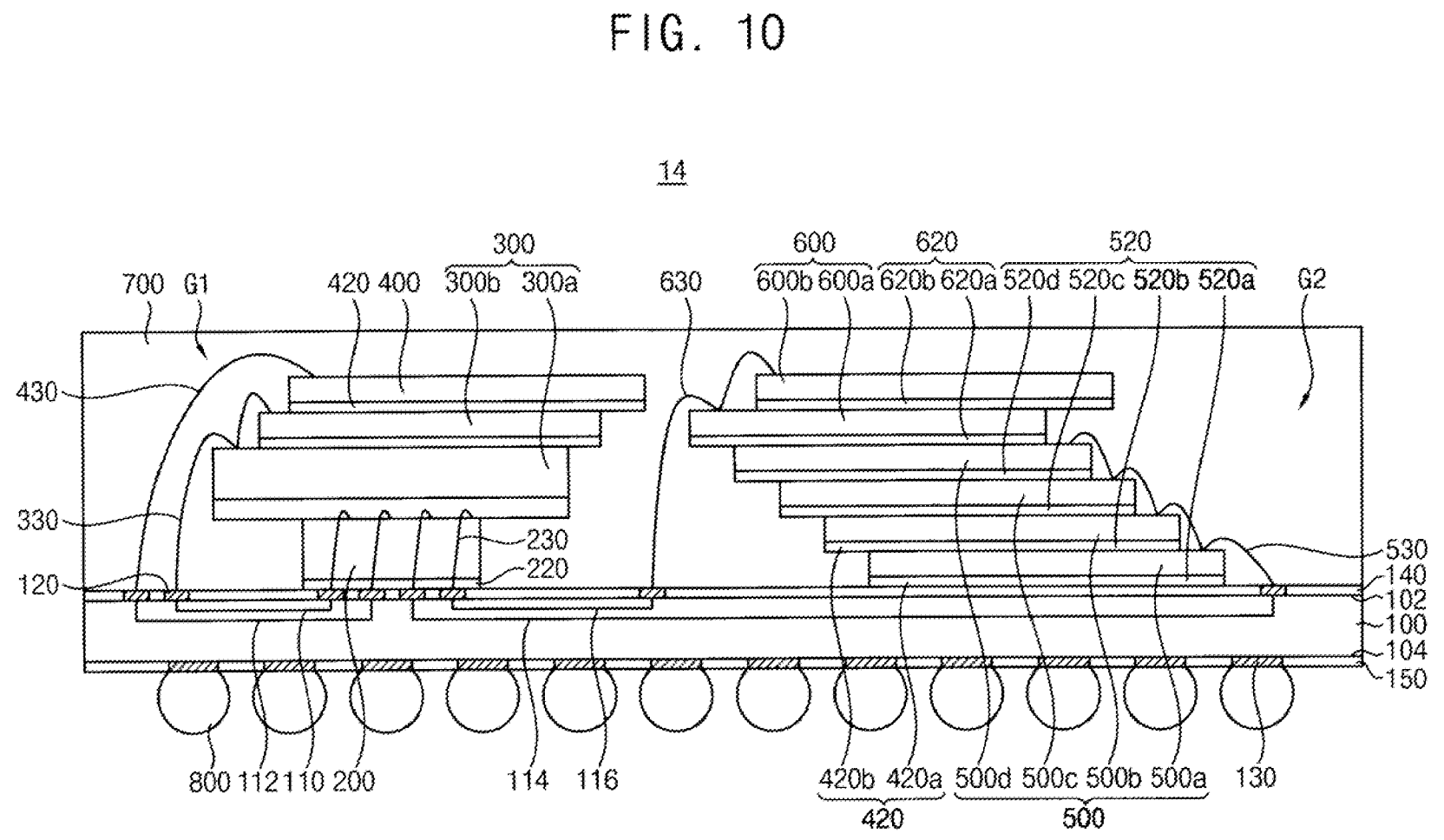

FIG. 10 is a plan view illustrating a semiconductor package in accordance with an example embodiment. FIG.

11 is a block diagram illustrating signal transmission channels in the semiconductor package in FIG. 10. The semiconductor package may be substantially the same as or similar to the semiconductor package described with reference to FIGS. 1 and 2 except for arrangements of stacked memory chips and channels. Thus, same reference numerals will be used to refer to the same or like elements and any further repetitive explanation concerning the above elements may be omitted.

Figure 11:
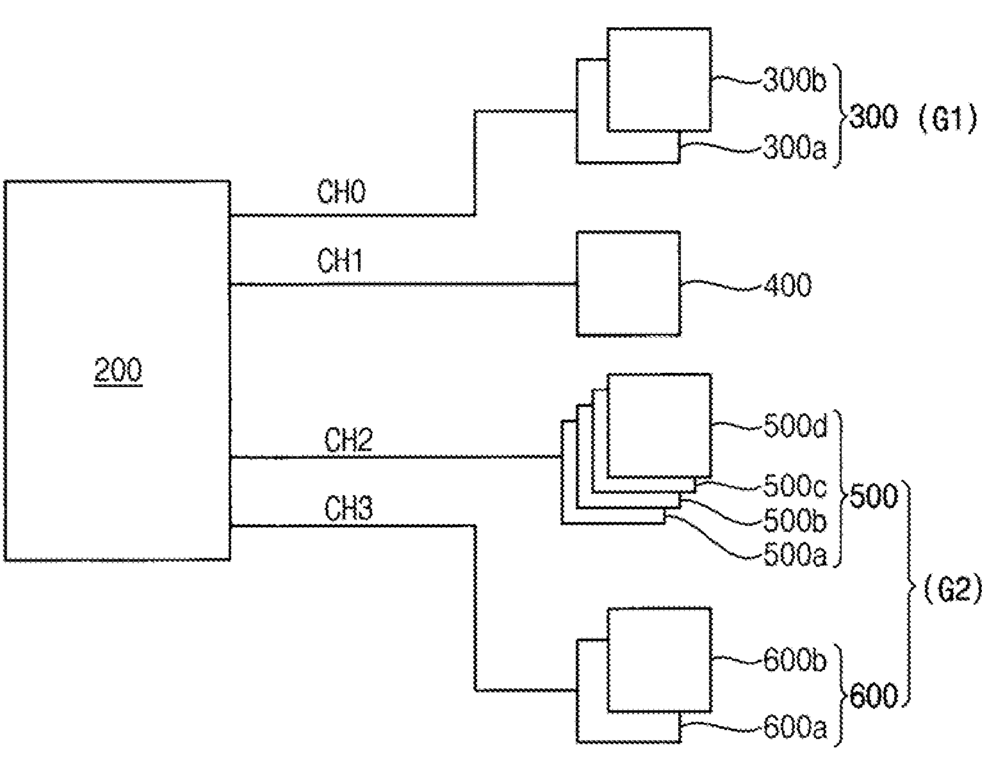
FIG. 11 is a block diagram illustrating signal transmission channels in the semiconductor package in FIG. 10.

Referring to FIGS. 10 and 11, a semiconductor package 40 may include a package substrate 100, a semiconductor chip 200, first and second stack structures G1, G2 including a plurality of memory chips, and a molding member 700. Additionally, the semiconductor package 10 may further include outer connection members 800.

In an example embodiment, the first stack structure G1 may be stacked on the semiconductor chip 200 on the package substrate 100. The first stack structure G1 may include a plurality (for example, a number P) of memory chips 300, 400 sequentially stacked on the semiconductor chip 200. The first stack structure G1 may include a first type of first memory chips 300*a*, 300*b* and a second type of a second memory chip 400.

The first memory chips 300*a*, 300*b* may be sequentially adhered on the semiconductor chip 200 using adhesive members 320*a*, 320*b*. The second memory chip 400 may be sequentially adhered on the semiconductor chip 200 using an adhesive member 420. The first memory chips 300*a*, 300*b* and the second memory chip 400 may be stacked in a cascade structure. The adhesive member may include, for example, an adhesive film such as a direct adhesive film (DAF).

A thickness of the lowermost first memory chip 300*a* of the first memory chips 300 may be greater than a thickness of other first memory chip 300*b*. When the lowermost first memory chip 300*a* has a relatively greater thickness, cracks may be prevented from occurring in the lowermost first memory chip 300*a*. An area of the lowermost first memory chip 300*a* may be greater than an area of the underlying semiconductor chip 200.

The first memory chips 300*a*, 300*b* may be electrically connected to the package substrate 100 by conductive connection members 330. For example, the conductive connection member 330 may electrically connect a chip pad of the first memory chip 300 to the substrate pad 120 of the package substrate 100. The conductive connection member 330 may include, for example, a bonding wire. The first memory chip 300 may be electrically connected to the package substrate 100 by a plurality of the conductive connection members 330.

The second memory chip 400 may be electrically connected to the package substrate 100 by conductive connection members 430. For example, the conductive connection member 430 may electrically connect a chip pad of the second memory chip 400 to the substrate pad 120 of the package substrate 100. The conductive connection member 430 may include, for example, a bonding wire. The second memory chip 400 may be electrically connected to the package substrate 100 by a plurality of the conductive connection members 430.

The types and the number of the memory chips of the first stack structure G1 may be varied. For example, the second memory chip 400 may include a plurality of memory chips.

In example embodiment, the second stack structure G2 may be stacked on the package substrate 100. The second stack structure G2 may be arranged on the package substrate 100 to be spaced apart from the first stack structure G1. The first and second stack structures G1, G2 may be arranged side by side on the package substrate 100. The second stack structure G2 may include a plurality (for example, a number Q) of memory chips 500, 600 sequentially stacked on the package substrate 100.

The second stack structure G2 may include the same type of the third memory chips 500*a*, 500*b*, 500*c*, 500*d* and the same type of the fourth memory chips 600*a*, 600*b*. The third memory chips 500*a*, 500*b*, 500*c*, 500*d* may be sequentially adhered on the package substrate 100 using adhesive members 520*a*, 520*b*, 520*c*, 520*d*. The fourth memory chips 600*a*, 600*b* may be sequentially adhered on the third memory chip 500 using adhesive members 620*a*, 620*b*.

For example, the third memory chips 500*a*, 500*b*, 500*c*, 500*d* and the lowermost fourth memory chip 600*a* may be stacked in a cascade structure. The third memory chips 500*a*, 500*b*, 500*c*, 500*d* and the lowermost fourth memory chip 600*a* may be sequentially offset-aligned in a direction toward the first stack structure G1 on the package substrate 100.

The third and fourth memory chips 500*a*, 500*b*, 500*c*, 500*d*, 600*a*, 600*b* may be electrically connected to the package substrate 100 by conductive connection members 530, 630. For example, the conductive connection members 530, 630 may electrically connect chip pads of the third and fourth memory chips 500, 600 to the substrate pad 120 of the package substrate 100. The conductive connection members 530, 630 may include, for example, a bonding wire. The third and fourth memory chips 500, 600 may be electrically connected to the package substrate 100 by a plurality of the conductive connection members 530, 630.

In an example embodiment, the memory chips of the first stack structure G1 may be electrically connected to the semiconductor chip 200 through the package substrate 100 by P channel(s), and the memory chips of the second stack structure G2 may be electrically connected to the semiconductor chip 200 through the package substrate 100 by Q channels (P and Q are natural numbers, for example, positive non-zero integers 1, 2, 3, etc.).

As illustrated in FIG. 11, the memory chips of the first stack structure G1 may be electrically connected to the semiconductor chip 200 by two channels CH0, CH1. The memory chips of the second stack structure G2 may be electrically connected to the semiconductor chip 200 by two channels CH2, CH3.

For example, the first memory chips 300*a*, 300*b* of the first stack structure G1 may be electrically connected to the semiconductor chip 200 by a first channel CH0. Two first memory chips 300*a*, 300*b* may share the first channel CH0. The first wiring 110 of the package substrate 100 may constitute a portion of the first channel CH0.

The second memory chip 400 of the first stack structure G1 may be electrically connected to the semiconductor chip 200 by a second channel CH1. The second wiring 112 of the package substrate 100 may constitute a portion of the second channel CH1.

The third memory chips 500*a*, 500*b*, 500*c*, 500*d* of the second stack structure G2 may be electrically connected to the semiconductor chip 200 by a third channel CH2. Four third memory chips 500*a*, 500*b*, 500*c*, 500*d* may share the third channel CH2. The third wiring 114 of the package substrate 100 may constitute a portion of the third channel CH2.

The fourth memory chips 600*a*, 600*b* of the second stack structure G2 may be electrically connected to the semiconductor chip 200 by a fourth channel CH3. Two fourth memory chips 600*a*, 600*b* may share the fourth channel CH3. The fourth wiring 116 of the package substrate 100 may constitute a portion of the fourth channel CH3.

Accordingly, the number (for example, 2) of paths (that is, the channels) of electrically connecting the memory chips of the second stack structure G2 and the semiconductor chip 200 may be the same as the number (for example, 2) of paths (that is, the channels) of electrically connecting the memory chips of the first stack structure G1 and the semiconductor chip 200. In this case, the number (for example, 6) of the memory chips of the second stack structure G2 may be greater than the number (for example, 3) of the memory chips of the first stack structure G1.

As described above, the first stack structure G1 and the second stack structure G2 may be arranged side by side on the package substrate 100. Thus, the number of the memory chips vertically stacked in one package may be reduced. Further, the memory chips of the first and second stack structures G1, G2 may be arranged asymmetrically to each other such that the number of the stacked memory chips of the first stack structure G1 is smaller than the number of the stacked memory chips of the second stack structure G2. Thus, the number of the memory chips of the first stack structure G1 stacked on the semiconductor chip 200 may be reduced, to thereby decrease the entire thickness of the package.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

By way of summation and review, in a general parallel arrangement of semiconductor chips, there may be deflection in an overhang portion due to a size difference between same/different types of the chips. Also, if a number of channels of the chips arranged in parallel is symmetric to each other, it may be difficult to reduce a thickness of a package structure while at the same time providing for a large number of chips to be included therein.

As described above, embodiments relate to a multi chip package having a plurality of stacked chips and a method of manufacturing the same.

Embodiments may provide a semiconductor package having a minimized size and a large memory performance, and capable of securing improved transmission speed characteristics, and a method of manufacturing the same.

In a semiconductor package according to an example embodiment, a height of a first stack structure stacked on a semiconductor chip may be reduced, to thereby decrease an entire thickness of the semiconductor package. Further, a design margin for the height of the first stack structure may be obtained. Thus, a lowermost memory chip of the first stack structure may be formed to be relatively thicker, which may help prevent cracks from occurring in the lowermost memory chip stacked on the semiconductor chip. Thus, an additional support spacer for supporting the first stack structure may be omitted, to thereby reduce manufacturing cost.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package comprising:

a substrate;

a first stack structure disposed on the substrate, and including a first chip, a second chip disposed on the first chip, and a third chip disposed on the second chip; and a second stack structure disposed on the substrate, and including a fourth chip, a fifth chip disposed on the fourth chip, and a sixth chip disposed on the fifth chip, wherein:

the first stack structure includes a controller, at least one of the first chip, the second chip, and the third chip is a memory chip and at least one of the fourth chip, the fifth chip, and the sixth chip is a memory chip, the number of memory chips in the second stack structure is greater than the number of memory chips in the first stack structure, the sixth chip is horizontally offset relative to the fifth chip toward the first stack structure, and an upper surface of the first stack structure and an upper surface of the second stack structure are coplanar or substantially coplanar.

2. The semiconductor package of claim 1, wherein:

the controller is an application-specific integrated circuit (ASIC), and each of the first stack structure and the second stack structure includes a plurality of NAND flash memories.

3. The semiconductor package of claim 1, wherein the first chip is the controller, and each of the second chip and the third chip is a memory chip.

4. The semiconductor package of claim 1, wherein the controller includes one or more pads.

5. The semiconductor package of claim 4, further comprising a plurality of bonding wires configured to electrically connect the controller to memory chips included in the first stack structure.

6. The semiconductor package of claim 5, wherein memory chips in the second stack structure are electrically connected to the controller via the plurality of bonding wires.

7. The semiconductor package of claim 1, wherein:

the first stack structure is vertically stacked in a first diagonal direction, a first subset of chips of the second stack structure is vertically stacked in a second diagonal direction that is opposite to the first diagonal direction, and a second subset of chips of the second stack structure is vertically stacked in the first diagonal direction.

8. The semiconductor package of claim 1, wherein the controller is mounted on the substrate in a flip chip bonding manner.

9. A semiconductor package comprising:

a substrate;

a first stack structure disposed on the substrate, and including a logic chip, a first chip disposed on the logic chip, and a second chip disposed on the first chip, wherein each of the first chip and the second chip is a memory chip; and a second stack structure disposed on the substrate, and including a third chip, a fourth chip disposed on the third chip, and a fifth chip disposed on the fourth chip, wherein each of the third chip, the fourth chip, and the fifth chip is a memory chip, wherein:

the number of memory chips in the second stack structure is greater than the number of memory chips in the first stack structure, at least two memory chips are electrically connected to the substrate directly via bonding wires, the second chip is horizontally offset relative to the first chip, the fifth chip is horizontally offset relative to the fourth chip, and an upper surface of the first stack structure and an upper surface of the second stack structure are substantially coplanar.

10. The semiconductor package of claim 9, wherein the logic chip is a controller.

11. The semiconductor package of claim 9, wherein at least two adjacent chips in at least one of the first stack structure and the second stack structure are vertically disposed with no horizontal offset.

12. The semiconductor package of claim 9, wherein the fifth chip is horizontally offset relative to the fourth chip toward the first stack structure.

13. The semiconductor package of claim 9, wherein the fourth chip is horizontally offset relative to the third chip, and wherein an offset direction of the fourth chip relative to the third chip is opposite to an offset direction of the fifth chip relative to the fourth chip.

14. The semiconductor package of claim 9, wherein the logic chip is mounted on the substrate in a flip chip bonding manner.

15. A semiconductor package comprising:

a substrate;

a first stack structure disposed on the substrate, and including a first chip, a second chip disposed on the first chip, and a third chip disposed on the second chip;

a second stack structure disposed on the substrate, and including a fourth chip, a fifth chip disposed on the fourth chip, and a sixth chip disposed on the fifth chip; and a first wire electrically coupling the second chip and the substrate;

a second wire electrically coupling the fourth chip and the substrate; and a third wire electrically coupling the sixth chip and the substrate, wherein:

at least one of the first chip, the second chip, and the third chip is a memory chip and at least one of the fourth chip, the fifth chip, and the sixth chip is a memory chip, the first stack structure includes a controller, the number of memory chips in the second stack structure is greater than the number of memory chips in the first stack structure, the second wire is positioned opposite to the third wire with respect to the second stack structure, and the controller is mounted on the substrate in a flip chip bonding manner.

16. The semiconductor package of claim 15, wherein:

the fifth chip is horizontally offset relative to the fourth chip, the sixth chip is horizontally offset relative to the fifth chip, and an offset direction of the fifth chip relative to the fourth chip is opposite to an offset direction of the sixth chip relative to the fifth chip.

17. The semiconductor package of claim 15, wherein the third chip is horizontally offset relative to the second chip toward the second stack structure.

18. The semiconductor package of claim 15, wherein a thickness of the controller is different from a thickness of a memory chip included in the first stack structure.

* * * * *